(12) United States Patent
Woodard et al.

(10) Patent No.: US 6,333,084 B1
(45) Date of Patent: *Dec. 25, 2001

(54) DOUBLE-SIDED REFLECTOR FILMS

(75) Inventors: F. Eugene Woodard, Los Altos; Thomas Pass, Sunnyvale; Ted L. Larsen, Palo Alto, all of CA (US)

(73) Assignee: Southwall Technologies, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/373,633

(22) Filed: Jan. 17, 1995

Related U.S. Application Data

(63) Continuation-in-part of application No. 08/303,342, filed on Sep. 9, 1994, now abandoned.

(51) Int. Cl.[7] .......................... B32B 15/04; B32B 27/06; B32B 27/16; B32B 27/36
(52) U.S. Cl. .......................... 428/34; 428/457; 428/458; 428/480; 428/622; 428/626; 428/672; 428/673; 428/141; 427/533; 427/535; 427/536; 204/192.1; 204/192.12; 204/192.22; 204/192.26; 204/192.27
(58) Field of Search .......................... 428/34, 141, 457, 428/458, 469, 471, 472, 480, 918; 204/192.12, 192.14, 192.26, 192.27, 192.29, 192.1, 192.22; 427/533, 534, 535, 536

(56) References Cited

U.S. PATENT DOCUMENTS

| | | | |
|---|---|---|---|
| 4,337,990 | * 7/1982 | Fan et al. ......... | 350/1.7 |
| 4,414,254 | * 11/1983 | Iwata et al. ......... | 428/34 |
| 4,510,190 | * 4/1985 | Glaser ......... | 428/34 |
| 4,769,261 | * 9/1988 | Belkind et al. ......... | 428/630 |
| 5,156,894 | * 10/1992 | Hood et al. ......... | 428/34 |
| 5,306,547 | * 4/1994 | Hood et al. ......... | 428/213 |
| 5,840,161 | * 11/1998 | Woodard et al. ......... | 204/192.14 |

OTHER PUBLICATIONS

Grant & Hackh's Chemical Dictionary, 5th Ed., p. 434, 1987.*

* cited by examiner

*Primary Examiner*—Vivian Chen
(74) *Attorney, Agent, or Firm*—Burns, Doane, Swecker & Mathis, LLP

(57) ABSTRACT

Durable—long lived plastic films carrying sputter-deposited metal layers such as reflective metal layers on both sides are disclosed. The slip side of the plastic film is not preglowed. The nonslip side is preglowed. This combination of glowing and not preglowing leads to the desired long life.

16 Claims, 3 Drawing Sheets

DOUBLE-SIDED REFLECTOR FILMS

This is a continuation-in-part of U.S. Ser. No. 08/303,342, filed Sep. 9, 1994, abandoned, which is incorporated by reference.

FIELD OF THE INVENTION

This invention relates to plastic films which carry metal-containing reflector layers on both sides. More particularly, it concerns such double-metal layer-carrying plastic films which are light transmissive and which exhibit long-term stability.

DESCRIPTION OF BACKGROUND MATERIALS

It is common practice to employ partially reflective—partially transmissive metal layer-bearing films in glazing structures. These films may, be applied to the surface of glass window glazing materials. They may be laminated into glazing structures. They may be suspended alone or in combination with other sheets of glazing. These products are characterized by transmitting substantial proportions, such as at least 20% to as much as 90% or more of visible light while substantially reflecting heat and near infrared wave length radiation. These products typically have a plastic film substrate which carries the reflector metal layer adherent to it.

As will be described in more detail, plastic films are often marketed with a coating, known in the art as a slip coating, on one side to facilitate handling during production and fabrication. The side of the film having the slip coating is called (not unexpectedly) the "slip" side. The other side is the "nonslip" side. Slip coatings generally work by texturing the surface of the film. Two representative approaches to this involve surface texturizing by adding small particles to the plastic film as shown in U.S. Pat. No. 3,884,870 (American Hoechst) and applying and cracking an organic coating on the film as shown in U.S. Pat. No. 4,302,506 (also American Hoechst).

These reflector products, as a general class, may be prepared by applying the reflective layer to the film with a wide range of chemical mirroring methods, vapor deposition processes and sputter deposition techniques. In sputtering, a plasma is created between two electrodes in a high vacuum chamber. This plasma causes atoms of one electrode (the target), which is either metal or a metal compound, to be dislodged and drawn toward the other electrode. The plastic film substrate is placed between the electrodes and the material dislodged from the target is deposited upon the substrate.

Sputtering processes are often accompanied by a pretreatment step called preglow. Preglow also employs a plasma that is generated under conditions such that little or no material is deposited upon the substrate. As the name implies, "preglowing" commonly takes place immediately prior to the sputtering steps which involve actual material deposition on the substrate.

One simple format for these films used heretofore involves a single partially transparent metal reflector layer adherent to one side of the plastic film. Another widely employed format has a partially transparent, partially reflective sequence of dielectric and metal layers on one side of the film. Often these layers are in a dielectric-metal-dielectric sequence. In other cases more than one metal layer can be present with the several metal layers bounded by and optionally separated by dielectric layers.

Also in the past it has been proposed to place reflective layers on both sides of a plastic film. This has not found acceptance because the products do not have UV acceptable stability. This has been a vexing problem since double-sided materials do possess certain theoretical performance advantages. The most widely used plastic substrates are polyester materials, most commonly poly(ethyleneteryshthalate) or "PET". We observed that when double-sided polyester products, that is polyester-based materials having metal-layer-containing, heat-reflective structures on both sides, were prepared using art-taught coating methods the products degraded and yellowed prematurely.

STATEMENT OF THE INVENTION

We have now discovered a way to make stable, durable, double-sided, double-metal-layer-containing, heat-reflective, light-transmissive plastic (e.g. polyester) films using sputter-depositing.

We have discovered that the life and durability of light-transmissive, heat and near infrared reflectors based on polyester films with metal-layer-containing reflectors on each side of the polyester film is improved by providing oxygen accessibility to the polyester film. This is accomplished by achieving at least a minimum level of oxygen permeability, that is 0.035 cc/(100 in$^2$×24 hours), in at least one of the metal-layer-containing reflectors.

We have also found that the oxygen permeability can be attained by assuring that at least one of the surfaces of the polyester film has a mean surface roughness ($R_a$) of at least about 8 nm at the time that the metal containing reflectors are sputter-deposited upon it. The desired level of oxygen permeability is achieved if this sputter-depositing is carried out in ways which preserve the surface roughness to a mean level of about 8 nm or greater. Although not required, this level of surface roughness is typically achieved on the slip side of slip-treated polyester films.

In accord with our invention we have found that a particular regimen of preglow treatment of the plastic (polyester) substrate leads to stable, durable double-sided reflective films. More particularly, we have discovered that when the slip-coated side of the plastic substrate has a mean surface roughness that is greater than about 8 nm, preglowing this surface can smooth and degrade the needed roughness. Thus, if the nonslip side of the plastic (polyester) film is preglowed and the slip side is not preglowed prior to depositing their respective reflective metal-layer-containing, heat-reflective coatings, the resulting product is durable and more stable (less prone to yellow prematurely) and more acceptable for commercial application. If the slip side is preglowed the desired product is not attained.

Thus, in one embodiment this invention provides a method for producing a reflective composite film. This method applies to plastic (polyester) film having a slip side and a nonslip side. It involves applying, by sputtering, a reflector structure including at least one metal layer to each side of the plastic film but preglowing only the nonslip side of the film. This method yields a coated film product which is significantly and unexpectedly more durable and long-lived than similar double-sided products made with the same plastic films preglowed on both sides.

In other aspects this invention is embodied as the product of this process or as a double-sided reflective film product per se. This film product has a plastic (polyester) film support. This plastic film has a nonslip side which has been modified by a preglow treatment and which carries a sputter-deposited metal-containing reflective layer adherent to it. It also has a slip side which has not been significantly modified by a preglow treatment and which also carries a sputter-deposited metal-layer-containing reflector layer.

In yet an additional aspect, this invention provides a plastic (polyester) film product which is light transmissive and which has metal-layer-containing heat and near infrared-reflective coatings on its slip side and on its nonslip side with these reflective coatings being such as to permit a plastic film-stabilizing quantity of oxygen to permeate to the film.

In yet an additional aspect, this invention provides an improvement in multipane window glazing structures in which a light transmissive, heat and near infrared-reflecting plastic film as suspended in a gas-filled dead space defined by two perimeter-sealed panes of glazing. This improvement involves using one of the double-sided polyester film based products of this invention and employing an oxygen-containing gas (e.g. from 1 to 20% $O_2$ by volume) as the gas filling the dead space.

DETAILED DESCRIPTION OF THE INVENTION

BRIEF DESCRIPTION OF THE DRAWINGS

This invention will be further described with reference being made to the accompanying drawings. In these drawings

DESCRIPTION OF PREFERRED EMBODIMENTS

Figure 1:
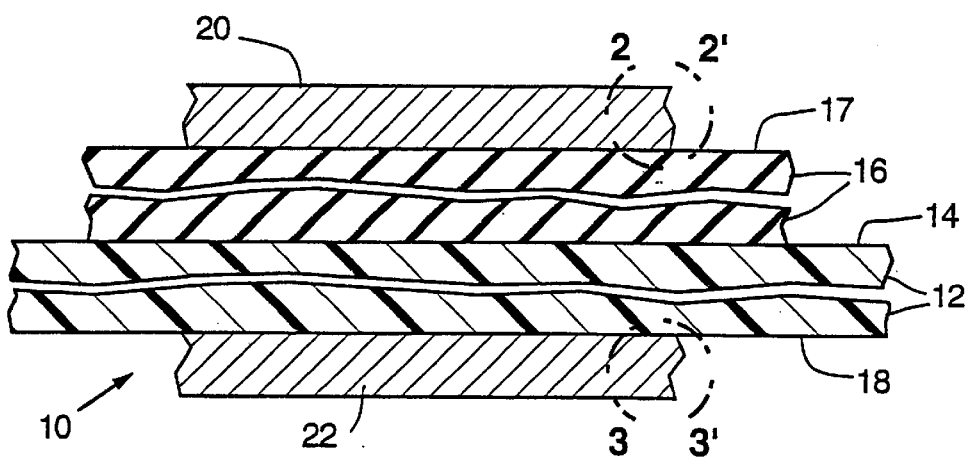
FIG. 1 is a schematic cross-sectioned view of a product of this invention.

The present invention provides effective long-lived double-sided light transmissive, heat and near infrared-reflective films. A general representation of such products is shown in FIG. 1 as film product 10. Film product 10 includes a plastic film substrate 12. This plastic film is typically from about 0.5 to about 5 or 10 or even 25 mils thick, although film thickness is not seen to be a limitation on the applicability of the invention.

Plastic film 12 is typically a flexible organic polymer film. The polymers which make up plastic film 12 are those which become yellow when exposed to ultraviolet radiation in the absence of oxygen. These polymers include polyesters generally. Representative polyesters include polyterephthalates such as poly(ethyleneterephthalate) ("PET") and poly(butyleneterephthalate), polyacrylates and methacrylates such as poly(methylmethacrylate) ("PMMA"), poly(methacrylate), and poly(ethylacrylate), and copolymers such as poly(methylmethacrylate-co-ethylacrylate) and the like. (A further description of suitable polyester materials may be found at pages 129–135 of the McGraw-Hill *Encyclopedia of Science and Technology*, Volume 14 (1987.) Polyterephthalates, such as poly(ethyleneterephthalate) (PET) and poly(butyleneterephthalate) are preferred polyesters for the plastic film 12, with PET being the most preferred. Other polymers having oxygen-dependent yellowing can also benefit from the practice of this invention and may be employed.

Although not a limitation to the application of this invention, clear, transparent, colorless plastic film materials give attractive final materials. When used in the context of film 12, the term "clear, transparent, colorless" means a plastic or polymer which, in its configuration of use, exhibits an integrated transmission over the visual wavelengths (400–700 Nm) of at least about 75%, i.e., from about 70% to about 95% without marked absorption or reflection peaks in this range. The polymers described above, when in typical configurations of use (i.e., plastic sheets or 0.5 to 5 to 25 mil thick films), commonly have from about 5 to about 20% reflection plus absorption, integrated over the visual wavelengths and thus integrated transmissions in the 80 to 95% range, and can qualify as "clear, transparent, colorless" substrates. For example, a 1 to 3 mil thick film of commercial PET reflects and absorbs a total of about 10 to 15% of the visible light cast upon it.

The polymer substrates themselves are commercially available or can be prepared by various art-known processes and do not, in and of themselves, constitute an aspect of this invention.

This plastic film has two surfaces, 14 and 18. Generally, at least one of these surfaces is prepared to obtain a degree of surface texturing which is necessary to improve the film handleability. One method to obtain the textured slip surface is to apply a primer layer or slip layer 16 which is typically thinner than the film itself but still is on the order of tenths of mils in thickness. Slip layer 16 is commonly selected from acrylate, polyester, and other organic polymeric materials suitable for improving the durability, handleability and/or processability of the plastic film. This slip layer can also be made to contribute to texture by stretching and fracturing. Alternatively, the textured surface may be obtained by incorporating particles into the polymer.

Slip layer 16 has a metal-containing reflective layer 20 adhered to it while surface 18 of substrate 12 also carries a reflective layer 22. These reflective layers 20 and 22 are characterized by being partially reflective and partially transparent and by having thin layers of metal in them. Most commonly, they are each designed to transmit at least about 20% of the total radiation present in visible light. The usual reason for incorporating layers such as 20 or 22 in a structure is to differentially transmit and reflect various portions of the electromagnetic spectrum. Most commonly, it is desired to preferentially reflect long wave lengths (heat) and transmit the wavelengths of visible light so as to achieve varying degrees of thermal control in architectural or automotive window settings.

Having two heat-reflecting, low emissivity coatings (one on each side of the suspended PET) is particularly advantageous with regard to long wavelength infrared radiation (i.e., heat) when PET is suspended between glass panels to obtain a thermally insulating window, No single reflector such as 20 or 22 is 100% effective at reflecting radiation. The non-reflected infrared energy is then conducted through the layers 12 and 16 and out the other side of the film structure. When, as in film 10, a second heat reflector/low emissivity coating is positioned on the other side of the film, it can at least partially reduce the transfer of the conducted infrared energy by suppressing reradiation. This thereby improves the thermal insulation properties of the suspended film.

While having two reflectors 20 and 22 is a help for blocking the transmission of the infrared radiation, prior to this invention, it also leads to problems. In accord with this invention, surface 18, the nonslip surface, may be subjected to a preglow treatment before reflector 22 is deposited upon it. In contrast, the slip side surface 14 or 17 is not preglowed in order to preserve the surface texture of the substrate which in turn increases the oxygen permeability of corresponding sputter-deposited coating. This preferential preglowing of only one side (side 18) of film 12 yields a product which has longer life and does not yellow or otherwise degrade at an unacceptable level during use.

The preglow that is applied to the nonslip side of the plastic substrate is generally classified as a mild or nonrobust glow. It is generally carried out using argon or air or some other oxygen-containing gas (i.e., a gas containing from about 5 to about 50% oxygen). A dc power source is used, with the preglow voltage ranging from about 750 to almost 5000 volts, and most commonly from about 1000 to about 3000 volts.

The reflective layers 20 and 22 are laid down by sputter-depositing upon the nonglowed slip side and glowed nonslip side of the film. These reflective layers can be simple thin layers of metal, for example silver, copper, gold, iridium, palladium, nickel, platinum, or the like. In our products, we prefer silver or mixtures or clads of metal in which silver predominates because of its excellent color neutrality and low visible absorption but,if this is not important, lower cost metals such as copper or nickel might be preferred.

Figure 2:
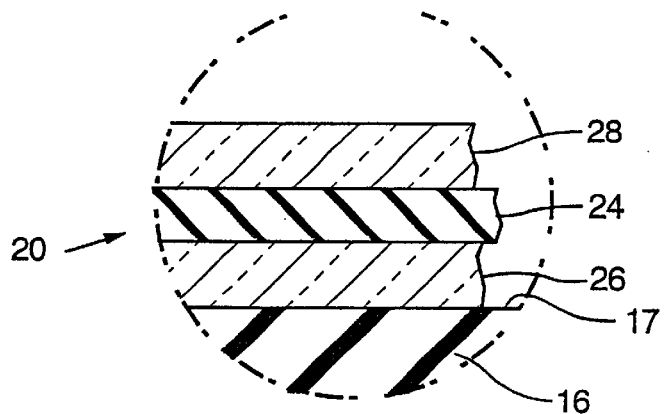
FIGS. 2 and 3 are expanded scale cross-sectioned views of regimes for the product of FIG. 1.
Figure 3:
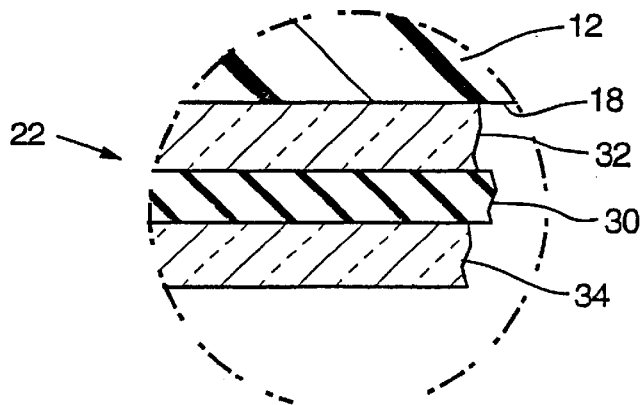

Often, however, better results are achieved if a combination of metal and dielectric layers are employed as illustrated in FIGS. 2 and 3. In FIG. 2 slip layer 16 is shown. A reflective metal layer 24 is also depicted bounded by layers of dielectric 26 and 28. These dielectric layers are known to enhance the performance (particularly visible transmission) and selectivity of the reflective layers.

As shown in FIG. 3, a combination of metal layer 30 and dielectric layers 32 and 34 can be applied to the nonslip side 18 of the plastic layer 12, as well. The metal layers are from about 30 to about 1,000 Å (and typically 40 to 400Å in thickness. The dielectric layers are from about 30 to about 1,500 Å in thickness. These configurations of layers are merely representative and do not by themselves constitute the present invention. Other configurations, such as those having multiple metal layers, can also be employed.

Examples of dielectric materials include, without limitation, metal oxides, nitrides and sulfides with metal oxides generally having real refractive indices greater than 1.7. Such oxides include for example: $TiO_2$, $Ti_2O_3$, $ZnO$), $Bi_2O_3$, $In_2O_3$, $SnO_2$, $ZrO_2$, and mixtures thereof.

The metal-layer-containing reflectors are applied to the treated plastic films using sputter-depositing. Sputter-depositing is a commercial process for depositing inorganic materials such as metals, oxides, and the like on surfaces Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode (target) in the presence of a gas to create a plasma. The action of the sputtering gas plasma on the target causes atoms of the target to be dislodged and to travel and deposit upon a substrate positioned adjacent to the sputtering source.

The thickness of the layer of material laid down is controlled by varying the voltage and current fed to the electrode targets, the gas flow rates and, in the case of continuous systems where the polymer surface and sputtering target move relative to one another, the speed at which the surface is moved past the target.

Typically, the sputtering gas is a nonreactive noble gas such as krypton or argon or the like. Argon is the most common sputtering gas because of its relatively attractive cost. In some sputtering processes, known as reactive sputtering processes, one adds substantial amounts of one or more reactive gases such as oxygen or nitrogen during the metal lay down. This results in a compound, such as an oxide or nitride, being formed and deposited.

Figure 4:
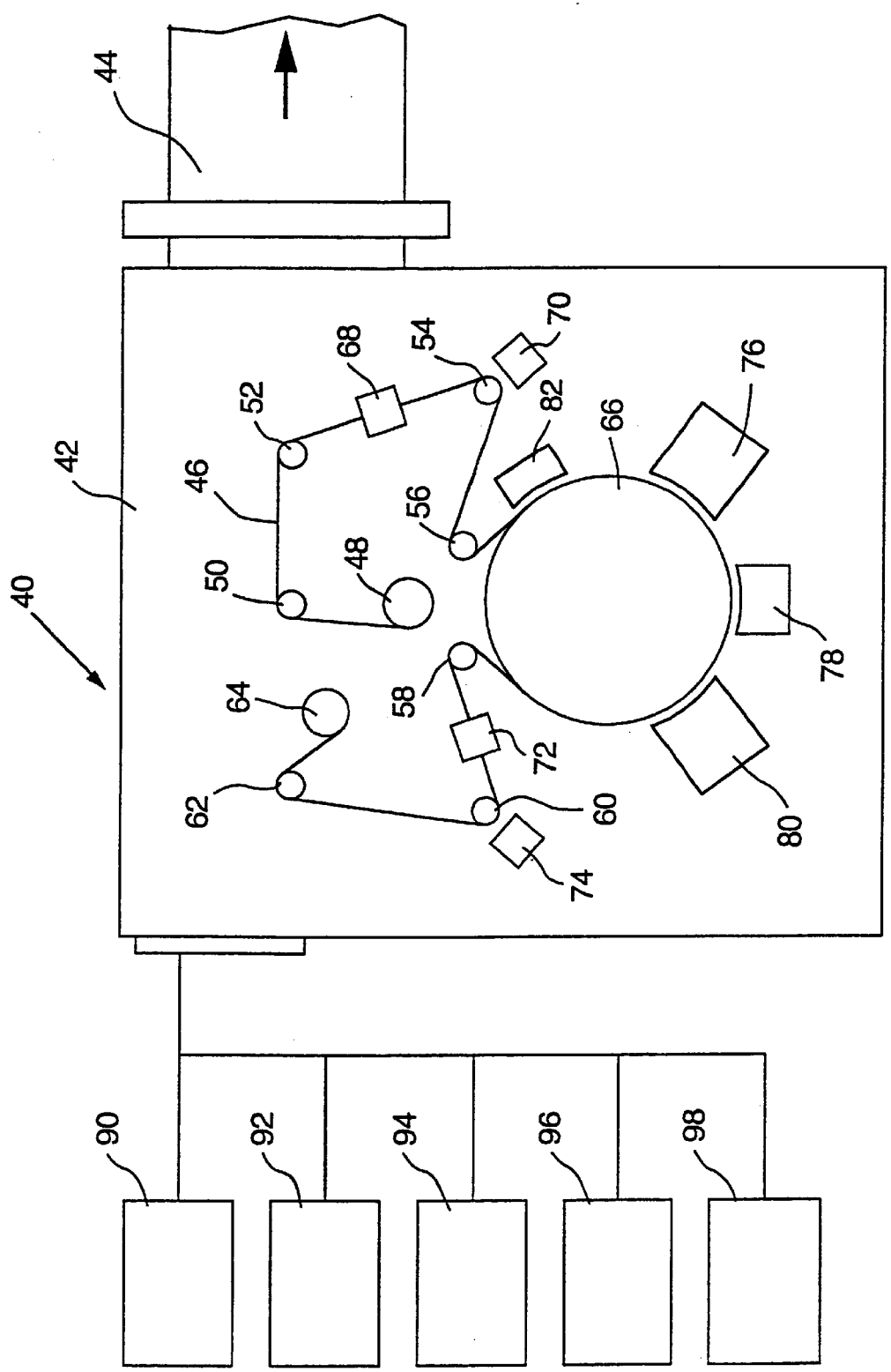
FIG. 4 is a diagram showing one type of equipment for carrying out the process and making the products of this invention.

FIG. 4 shows a continuous web coating sputtering system 40 suitable for laying down these various layers. System 40 includes vacuum chamber 42 which is evacuated via line 44. Contained within chamber 42 is a drive mechanism for moving a sheet of flexible polymer film 16 past a series of magnetron sputtering stations 80, 78, and 76. The drive mechanism includes feed roll 48, idlers 50, 52, 54, 58, 60 and 62 and take-up roll 64.

The film passes around chilled idler drum 66 as well. The film passes a pair of monitors for determining its transmittance, 68, and reflectance, 70, before coating and a similar pair of monitors 72 and 74 after coating. This coater is configured to simultaneously sputter deposit up to three layers on the plastic film using three separate DC magnetron cathodes 76, 78 and 80. Typically, cathode 76 is used to lay down a first dielectric sealing and nucleating layer. Cathode 78 can be used to lay down the reflective metal layer. Cathode 80 can be used to lay down an overcoating antireflecting dielectric layer, if desired. Also located in the system is a preglow station 82 for treating the nonslip side of the plastic film before coating. Each of these four stations is isolated from each other in space as a minichamber (see U.S. Pat. No. 4,298,444), thereby producing a local environment for the containment of the various plasma gases. This allows separate processes to be carried out simultaneously at each station with variations in atmosphere from station to station but with minimal cross-contamination among the four sources.

The control and monitoring of the sputtering system are normally accomplished using equipment and sensors which are common in machines of this type. These are shown in FIG. 4 and include: 1) mass flow controllers 88 (MKS) for regulation of gas flow into the cathode minichambers; 2) 5–10 kilowatt DC power supplies 90 (Advanced Energy) for all three sputtering cathodes; 3) an optical monitoring system 92 (Hexatron/Southwall Technologies) which measures both reflectance and transmission of the film over the spectral region from 360 to 2,000 nm; 4) a film motion control system 94 (Drivex) which regulates the tension, speed, and distance of the film as it moves through the system, and preglow power supply 96.

When carrying out the process of the invention there is some latitude in the order in which the preglow and the various depositions are carried out. For example, the nonslip surface can be preglowed as a first step followed by depositing the two reflectors in either order. Alternately, the slip side reflector can be applied followed by the nonslip side preglow and the deposit of the nonslip side reflector. In addition, when multi-layer reflectors are employed it is, at least in theory, possible to divide up the deposition of some of these layers. However, based on experience in the manufacture of other products, it is usually preferred to have the preglow immediately precede the lay down of the nonslip side reflector.

The invention will be further described by the following examples and comparative experiments. These merely set forth particular embodiments of the invention and are not to be construed as limiting the invention's scope which is defined by the claims.

EXAMPLES

In Example 1, the preparation of a material of the invention is described. In Comparative Examples A and B, the preparation of a single-sided material and a double-sided material not of the invention are described.

In Example 2, the testing of the three materials to determine yellowing rates is described. Oxygen-permeability was also determined for various materials and is reported.

Example 1

A film product of the invention was prepared as follows. A supply of 3 mil thick poly(ethyleneterephthalate) was obtained from Teijin. This material, had a polymeric slip coat on one side. The other side was uncoated.

This material was converted into a double-sided reflector film as follows: It was loaded into a laboratory scale moving web sputtering unit of the general type shown in FIG. 4. This preparation involved a two pass coating operation with a three cathode dielectric/metal/dielectric ("DMD") stack being deposited on both sides of the substrate. In the first pass, the nonslip side was coated using a dc preglow. In the second pass, the slip side was coated with the DMD coating using no dc preglow.

Pass I Deposition Conditions:
Linespeed: 7.74 mm/sec
Substrate Side: nonslip
Approximate stack design: 410 Å $In_2O_3$/90 Å Ag/410 Å $In_2O_3$
Preglow: 1500 V @ 32.5 mA, 13.6 sccm of air, pressure $10\times10^{-3}$ Torr.
Cathode 1: Indium sputtered reactively to obtain $In_2O_3$.
  36.4 sccm oxygen
  16.4 sccm hydrogen
  4 sccm nitrogen
  5 sccm argon
  pressure: $4.5\times10^{-3}$ Torr
  16.24 A @ 339 V (5.51 Kw)
Cathode 2: Silver dc sputtered.
  12.3 sccm argon
  pressure: $3.0\times10^{-3}$ Torr
  1.13 A @ 447 V (0.51 Kw)
Cathode 3: Indium sputtered reactively to obtain $In_2O_3$.
  34.4 sccm oxygen
  32.6 sccm hydrogen
  4 sccm nitrogen
  5 sccm argon
  pressure: $5.2\times10^{-3}$ Torr
  18.52 A @ 302 V (5.60 Kw)

Pass II Deposition Conditions:
Linespeed: 7.74 mm/sec
Substrate Side: slip side
Approximate stack design: 410 Å $In_2O_3$/90 Å Ag/410 Å $In_2O_3$
Preglow: off, 11.0 sccm of air, pressure ca $10\times10^{-3}$ Torr.
Cathode 1: Indium sputtered reactively to obtain $In_2O_3$.
  36.8 sccm oxygen
  16.6 sccm hydrogen
  4 sccm nitrogen
  5 sccm argon
  pressure: $4.7\times10^{-3}$ Torr
  16.22 A @ 339 V (5.50 Kw)
Cathode 2: Silver dc sputtered.
  12.3 sccm argon
  pressure: $3.0\times10^{-3}$ Torr
  1.14 A @ 441 V (0.50 Kw)
Cathode 3: Indium sputtered reactively to obtain $In_2O_3$.
  33.2 sccm oxygen
  31.5 sccm hydrogen
  4 sccm nitrogen
  5 sccm argon
  pressure: $5.2\times10^{-3}$ Torr
  18.66 A @ 300 V (5.60 Kw)

Comparative Experiment A

For the purposes of comparison, a single-sided product was produced in the same equipment. This material consisted of a single pass, dielectric/metal/dielectric stack deposited onto the slip side of the Teijin 3 mil PET with a dc preglow. A three cathode with preglow process was used. This sample was prepared to demonstrate that glowing the slip side of the substrate and reducing surface texture, did not cause accelerated yellowing, provided the opposite side of the substrate was not coated.

The dc preglow operating conditions used to prepare this sample were those which were required in order to deposit silver onto the slip side of PET with similar optical properties as obtained when the nonslip side was coated. In particular, the glow voltage and current were increased as required to minimize visible absorption.

Deposition conditions:
Linespeed: 6.46 mm/sec
Substrate Side: slip side
Approximate stack design: 300 Å $In_2O_3$/90 Å Ag/550 Å $In_2O_3$
Preglow: 2500 V @ 100 mA, 8.2 sccm of air, pressure $10\times10^{-3}$ Torr.
Cathode 1: Indium sputtered reactively to obtain $In_2O_3$.
  22.8 sccm oxygen
  10.3 sccm hydrogen
  4 sccm nitrogen
  5 sccm argon
  pressure: $3.5\times10^{-3}$ Torr
  7.7 A @ 332 V (2.56 Kw)
Cathode 2: Silver dc sputtered.
  13 sccm argon
  pressure: $3.0\times10^{-3}$ Torr
  0.92 A @ 438 V (0.40 Kw)
Cathode 3: Indium sputtered reactively to obtain $In_2O_3$.
  35.8 sccm oxygen
  34.0 sccm hydrogen
  4 sccm nitrogen
  5 sccm argon
  pressure: $5.4\times10^{-3}$ Torr
  17.84 A @ 313 V (5.58 Kw)

Comparitive Experiment B

Also for purposes of comparison, a second double-sided material was prepared. It was similar to the material of Example 1 and was produced in the same equipment, but had each of its sides preglowed before reflector deposition. This sample was produced to demonstrate that adverse effects of glowing the slip treatment off if both sides of the substrate are coated.

This sample involved a two pass coating operation with a three cathode (i.e. dielectric/metal/dielectric) stack being deposited on each side of the substrate. In the first pass I, the nonslip side of Teijin 3 mil PET was coated using a dc preglow. In the second pass, the slip side of the PET substrate was coated with the DMD coating also using a dc preglow. The dc preglow operating conditions used in the second pass was that which was required in order to deposit silver onto the slip side of PET with similar optical properties as obtained when the nonslip side was coated. (i.e. similar to example A.)

Pass I Deposition conditions:
  Linespeed: 17.25 mm/sec
  Substrate Side: nonslip
  Approximate stack design: 200 Å $In_2O_3$/90 Å Ag/200 Å $In_2O_3$
  Preglow: 1500 V @ 40 mA, 14.4 sccm of air, pressure $11 \times 10^{-3}$ Torr.
  Cathode 1: Indium sputtered reactively to obtain $In_2O_3$.
    38.4 sccm oxygen
    17.4 sccm hydrogen
    4 sccm nitrogen
    5 sccm argon
    pressure: $4.7 \times 10^{-3}$ Torr
    15.90 A @ 345 V (5.49 Kw)
  Cathode 2: Silver dc sputtered.
    12.6 sccm argon
    pressure: $3.0 \times 10^{-3}$ Torr
    2.12 A @ 544 V (1.15 Kw)
  Cathode 3: Indium sputtered reactively to obtain $In_2O_3$.
    36.2 sccm oxygen
    34.4 sccm hydrogen
    4 sccm nitrogen
    5 sccm argon
    pressure: $5.4 \times 10^{-3}$ Torr
    17.54 A @ 317 V (5.56 Kw)

Pass II Deposition Conditions:
  Linespeed: 6.46 mm/sec
  Substrate Side; slip side
  Approximate stack design: 300 Å $In_2O_3$/90 Å Ag/550 Å $In_2O_3$
  Preglow: 2500 V @ 100 mA, 8.0 sccm of air, pressure $11 \times 10^{-3}$ Torr.
  Cathode 1: Indium sputtered reactively to obtain $In_2O_3$.
    22.5 sccm oxygen
    10.2 sccm hydrogen
    4 sccm nitrogen
    5 sccm argon
    pressure: $3.5 \times 10^{-3}$ Torr
    7.76 A @ 332 V (2.58 Kw)
  Cathode 2: Silver dc sputtered.
    13.0 sccm argon
    pressure: $3.0 \times 10^{-3}$ Torr
    0.92 A @ 437 V (0.40 Kw)
  Cathode 3: Indium sputtered reactively to obtain $In_2O_3$.
    15.1 sccm oxygen
    33.5 sccm hydrogen
    4 sccm nitrogen
    5 sccm argon
    pressure: $5.4 \times 10^{-3}$ Torr
    17.90 A @ 311 V (5.57 Kw)

Example 2

The QUV a Yellowing Test

To determine the rate at which PET based reflector samples yellow when exposed to solar radiation, an accelerated test was done. In this test sample films were suspended into sealed air-filled insulated glass units "igu's." The igu's are fabricated using low iron glass (i.e. UV transmissive) on the exposed side of the unit. As described in ASTM G53-84, samples were exposed to a UVA-351 bulb through 3 mm low iron glass supplied by Schott. The UV exposure was applied at a 100% duty cycle and a one sun intensity. During the exposure, the samples were held at 60° C. and a relative humidity of 40%.

Figure 5:
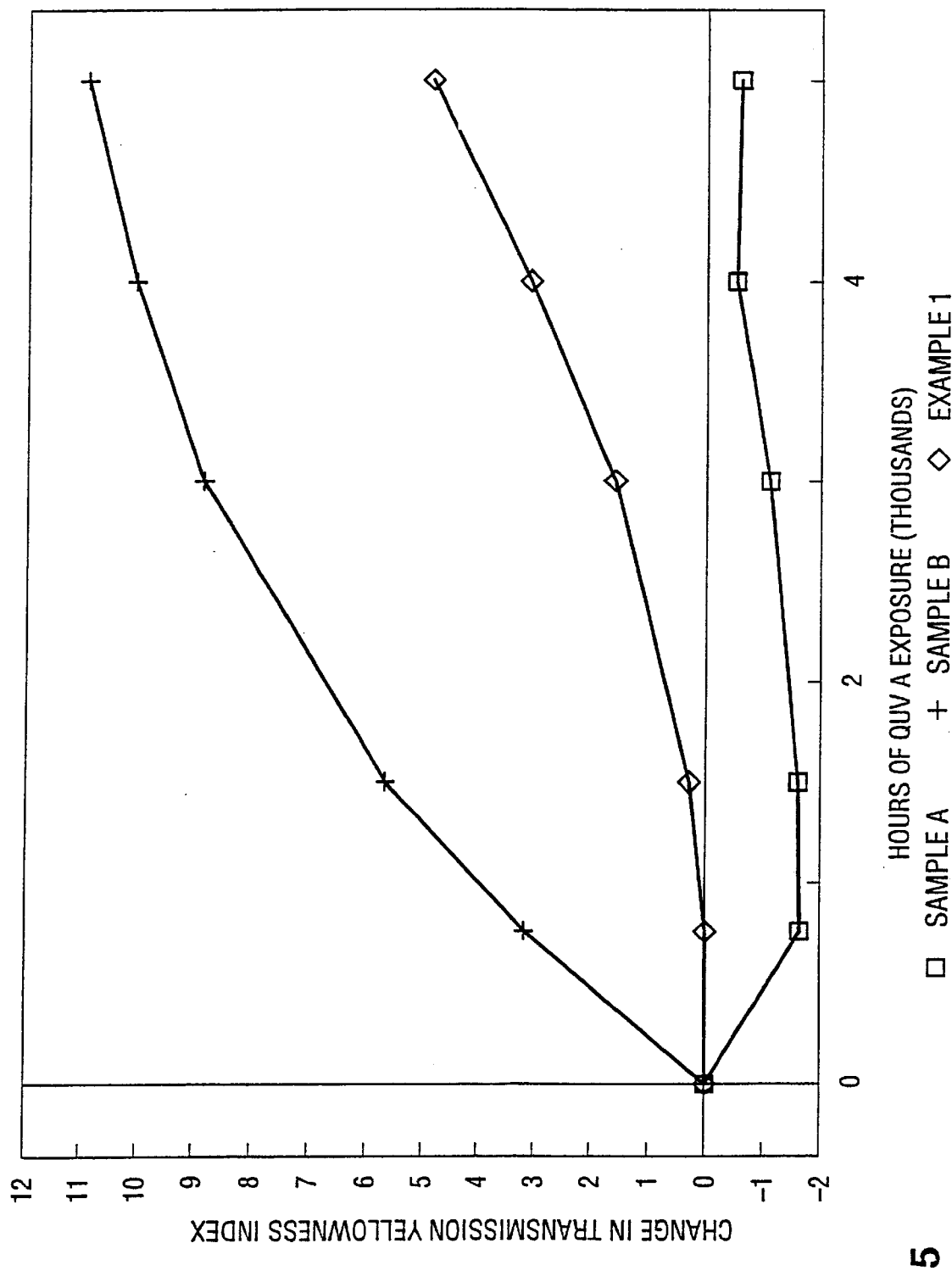
FIG. 5 is a graph showing the improved resistance to discoloration achieved in products of this invention.

The results of this exposure for three different samples (Example 1, A and B) are given in FIG. 5.

Sample B is a double sided reflector on PET. In single sided reflectors in the past the nonslip side of PET is coated with a reflective layer using a dc preglow to enhance the adhesion of the coating to PET. When the reflective coating is applied to the slip side using standard deposition conditions, the visible absorption of the coating is higher than normal leading to reduced visible transmission. It was determined that this could be corrected by increasing the voltage and current of the preglow. Thus in sample B an intense dc preglow was used when coating the slip side. As evident from FIG. 5, when a double sided coating was prepared in this manner, the yellowness index increases rapidly. (A change of about three in yellowness index is visually detectable.)

In sample A, the slip side of PET was sputter coated, just as had been done in sample B (i.e. a robust dc preglow was used). However sample A differed from sample B in that only one side of the substrate was sputter coated. As evident from the yellowing data for sample A in FIG. 5, if the front side of the PET was left uncoated, the coating process used on the slip side of both samples A and B did not lead to a rapid yellowing rate.

In the sample of Example 1, the coating was deposited directly onto the slip side of Teijin PET without a preglow. As evident from FIG. 5, this sample yellows much more slowly than the other double sided sample (i.e. sample B). This is thought to be due to the increased oxygen permeability realized when a non-glowed slip agent (as present in the Teijin film), is sputter coated.

In light of our prior work (which included weathering films in inert gas environments as discussed below), the results given above, and the oxygen permeability results reported below, it was concluded that sample B yellowed quickly because the oxygen flow to the PET substrate was severely restricted. It is believed that this is due to a high quality (i.e. dense and pinhole free) sputtered silver layer being on both sides of the substrate.

This explanation is further supported by our observation that when a film having a reflective layer on a single side of PET is exposed to UVA radiation in the absence of oxygen (i.e. in either krypton or argon), the rate of yellowing is increased by 2 or 3 times.

Also, measurements have shown that when the slip side of PET substrate is sputter coated with a reflector stack without a preglow, the oxygen permeability of the coating is about three times higher than when the nonslip side is coated using a standard preglow. In particular, samples coated on the slip side without a preglow were determined to have an average oxygen permeability of 0.0563 cc/(100 $in^2 \times 24$ hr) and samples coated on the nonslip side with a standard preglow had an average oxygen permeability of 0.0179 cc/(100 $in^2 \times 24$ hr).

Based on these results, we have determined that a film carrying a pair of reflector permitting less than about 0.035 cc/(100 in/24 hr) of $O_2$ to permeate are less preferred and that a pair of reflectors at least one of which permits more than 0.035 and especially from about 0.035 to about 1.0 and more especially from about 0.05 to about 0.50 cc/(100 in/24 hr) of $O_2$ are preferred. These amounts constitute preferred film-stabilizing amounts.

To determine degrees of surface texture required to achieve acceptable oxygen permeabilities after sputter coating, the surface roughnesses of uncoated PET films can be determined using an atomic force microscope such as to the Digital Instruments Nanoscope III AFM/STM. Areas of 100 um×100 um are imaged. High resolution Tapping Mode™ AFM instrumentation with etched silicon tips were used in this analysis.

Mean surface roughnesses ($R_a$) are calculated using the following formula $$R_a=[1/(L_xL_y)]\int_o^{L_y}\int_o^{L_x}\{f(x,y)\}dx\,dy$$

where F(x,y) is the surface relative to the "Center Plane" and Lx and Ly are the dimensions of the surface. "Center Plane" is defined as a flat plane which intersects the image surface such that the image surface bounds equal volumes above and below the Center Plane.

The $R_a$ value determined for the slip side of representative Teijin substrate varied between 11 and 20 nm depending on cross web position. The centers typically have lower surface roughnesses, such as from 8–14 nm.

The surface roughness of the non-slip side of the substrate are substantially lower, typically 4 to 5 nm. High voltage, high current glowing of the slip side of Teijin substrate (as described above in comparative examples A and B) has been found to reduce the mean roughness by a factor of 2. When the mean roughness is reduced to below 8 nm, an unacceptable product results.

We claim:

1. A double-sided heat reflector composite film made up of polyester film having a slip side and a nonslip side each side carrying a metal-containing reflector layer and produced by the method, comprising
   a. preglowing only the nonslip side of the film
   b. sputter-depositing a nonslip side reflector layer on the preglowed nonslip side of the film and
   c. sputter-depositing a slip side reflector layer on the nonpreglowed slip side of the film, said film exhibiting a change in yellow index of less than 3 when tested by ASTM G53-84 yellowing test for 2000 hours.

2. The film of claim 1 wherein the sputter-depositing of the nonslip side reflector layer in step b comprises the substeps of:
   b1. sputter-depositing a first dielectric layer
   b2. sputter-depositing a metal layer and
   b3. sputter-depositing a second dielectric layer and
   the sputter-depositing of the slip side reflector layer in step c comprises the substeps of:
   c1. sputter-depositing a first dielectric layer
   c2. sputter-depositing a metal layer and
   c3. sputter-depositing a second dielectric layer.

3. A double-sided heat reflector composite film made up of polyester film having a slip side and a nonslip side each side carrying a metal-containing reflector layer and produced by the method comprising
   a. preglowing only the nonslip side of the film
   b. sputter-depositing a slip side reflector layer on the nonpreglowed slip side of the film and
   c. sputter-depositing a nonslip side reflector layer on the preglowed nonslip side of the film, said film exhibiting a change in yellow index of less than 3 when tested by ASTM G53-84 yellowing test for 2000 hours.

4. The film of claim 3 wherein the sputter-depositing of the slip side reflector layer in step b comprises the substeps of:
   b1. sputter-depositing a first dielectric layer
   b2. sputter-depositing a metal layer and
   b3. sputter-depositing a second dielectric layer and
   the sputter-depositing of the nonslip side reflector layer in step c comprises the substeps of:
   c1. sputter-depositing a first dielectric layer
   c2. sputter-depositing a metal layer and
   c3. sputter-depositing a second dielectric layer.

5. A double-sided heat reflector composite film made up of polyester film having a slip side and a nonslip side each side carrying a metal-containing reflector layer produced by the method comprising
   a. sputter-depositing a slip side reflector layer on the nonpreglowed slip side of the film
   b. preglowing only the nonslip side of the film and
   c. sputter-depositing a nonslip side reflector layer on the preglowed nonslip side of the film, said film exhibiting a change in yellow index of less than 3 when tested by ASTM G53-84 yellowing test for 2000 hours.

6. The film of claim 5 wherein the sputter-depositing of the slip side reflector layer in step a comprises the substeps of:
   a1. sputter-depositing a first dielectric layer
   a2. sputter-depositing a metal layer and
   a3. sputter-depositing a second dielectric layer and
   the sputter-depositing of the nonslip side reflector layer in step c comprises the substeps of:
   c1. sputter-depositing a first dielectric layer
   c2. sputter-depositing a metal layer and
   c3. sputter-depositing a second dielectric layer.

7. A sputter-deposit-produced light transmissive, heat and near infrared reflector sheet comprising:
   a light transmissive polyester film of 0.5 to 25 mil thickness having a first side and a second side
   each side carrying a sputter-deposited light transmissive heat and near infrared reflector comprising a metal layer, said metal layer having a thickness of 40 to 400 Å,
   the first side being a nonpreglowed slip side having a mean roughness of 8 nm or greater at the time of sputter deposition thereupon and the second side being either a preglowed slip side or a preglowed nonslip side,
   said film exhibiting human eye undetectable degrees of yellowing when tested by ASTM G53-84 yellowing test for 200 hours.

8. The sheet of claim 7 wherein the second side is a slip side.

9. The sheet of claim 7 wherein the second side is a nonslip side.

10. The sheet of claim 7 wherein the polyester is PET.

11. The sheet of claim 10 wherein the metal in each reflector comprises silver.

12. The sheet of claim 10 wherein the metal in each reflector comprises silver/gold alloy.

13. The sheet of claim 10 wherein the metal in each reflector comprises a silver metal-containing layer and a gold-containing layer.

14. The sheet of claim 7 wherein each reflector additionally comprises one or more sputter-deposited dielectric layers.

15. The sheet of claim 14 wherein each reflector comprises in sequence a sputter-deposited dielectric layer, a sputter-deposited silver-containing metal layer and a sputter-deposited dielectric layer.

16. In a multipane window glazing comprising two parallel rigid transparent glazing sheets sealed around their perimeter and defining a gas-filled dead volume with a sheet of heat reflective transparent plastic suspended in the gas-filled dead volume,
   the improvement comprising, employing the film of claim 7 as the sheet of heat reflective transparent plastic and employing an oxygen-containing gas as the filling for the dead volume.

* * * * *